United States Patent [19]

Fenster

[11] Patent Number: 4,602,310
[45] Date of Patent: Jul. 22, 1986

[54] APPARATUS AND METHOD FOR DISSIPATING AND DISCHARGING ELECTROSTATIC CHARGES

[76] Inventor: Raynard M. Fenster, 4500 Lowell Blvd., Denver, Colo. 80211

[21] Appl. No.: 715,659

[22] Filed: Mar. 25, 1985

[51] Int. Cl.$^4$ ............................................. H05F 1/00
[52] U.S. Cl. ..................................... 361/212; 361/220
[58] Field of Search ................ 361/212, 216, 220, 222

[56] References Cited

U.S. PATENT DOCUMENTS

| 2,568,068 | 9/1951 | Harpman | 361/222 |
| 3,991,479 | 11/1976 | Dionne | 361/212 X |
| 4,398,277 | 8/1983 | Christiansen et al. | 361/220 |

Primary Examiner—L. T. Hix
Assistant Examiner—Douglas S. Lee
Attorney, Agent, or Firm—Timothy J. Martin

[57] ABSTRACT

An apparatus and method is provided to dissipate and discharge electrostatic charge accumulated on an appliance. The device includes an open cell conductive foam body mounted in an enclosure. A plurality of magnets are embedded in the foam body and produce a looped magnetic field of relatively high flux density. A probe has a conductive pick-up head attached to the appliance and an electrical lead extends from the pick-up to make electrical contact with the foam body. A ground contact is embedded in the magnetic field at a position spaced from the electrical lead contact, and a ground wire electrically connects the foam body to ground potential. The method includes the steps of making electrical contact to the appliance by a conductive lead, dissipating the electrostatic charge under the influence of a magnetic field in a conductive foam body, and discharging the electrostatic charge to ground potential.

27 Claims, 8 Drawing Figures

APPARATUS AND METHOD FOR DISSIPATING AND DISCHARGING ELECTROSTATIC CHARGES

BACKGROUND OF THE INVENTION

The present invention relates to the dissipation and discharge of static electricity, such as static electricity that accumulates on an electrical appliance. In particular, the apparatus and method described herein is particularly useful for eliminating static electricity from cathode-ray tubes, microprocessors, and other sensitive electronic equipment. The present device, then, is an add-on item that interconnects the appliance's surface to be discharged with an electrical ground in order to help alleviate the potential for malfunction and/or damage to the appliance due to the build-up of static electricity.

In recent years, there has been a substantial increase in the use of large scale integrated circuits in sophisticated electronic devices. As the demand for more powerful chips has increased, the size of the integrated circuits have diminished. This smaller size makes integrated circuit chips more susceptible to malfunctioning since the routing channels between the circuit elements is smaller. When large electrical potentials build up as a result of static electricity, the electrostatic fields may interfere with the proper functioning of the integrated circuits, and, when an uncontrolled electrostatic discharge takes place, the integrated circuits may be physically damaged. In addition, the discharge through the integrated circuit may cause a malfunction of the circuit's processing capabilities. Further, the build-up in the electrostatic field increases the accumulation of dust and other unwanted, charged particles on the integrated circuit devices as well as upon the screen of cathode-ray tubes. This dust accumulation further can degrade the performance of the appliance.

The problems associated with electrostatic charge build up have recently been recognized as a possible threat to sensitive electronic devices. Accordingly, there have been some attempts in the past to provide some protection against electrostatic discharge, but these techniques have departed significantly from the invention described herein. One device shown in U.S. Pat. No. 4,398,277, issued Aug. 9, 1983, to Robert Christiansen is directed to the discharge of triboelectric charges brought to the electronic equipment by the equipment operators or other persons who come within the vicinity of the electronic appliances. However, none of the known prior art devices are directed to the dissipation and discharge of electrostatic charges that are generated by the equipment during its operation.

Accordingly, there remains an unfulfilled need for a method and apparatus that is effective in dissipating and discharging electrostatic charges associated with electronic appliances. There is a further need for such a method and apparatus that may be attached to existing electronic equipment as an "add on" protective device that prevents damage to or malfunction of the electronic equipment. There is a further need for such a protective device that is both easy to connect and which is relatively inexpensive in cost so that it may be retrofitted onto the numerous existing appliances that experience problems with electrostatic build-up.

SUMMARY OF THE INVENTION

It is an object of the present invention to provide a new and useful method and apparatus for dissipating and discharging electrostatic charges associated with an electronic appliance.

It is another object of the present invention to provide a method and apparatus for eliminating damage or malfunctioning of electronic appliances which apparatus is relatively inexpensive to produce and which may be readily mounted to an existing appliance as an "add on" protective device.

A still further object of the present invention is to provide a method and apparatus that is employed to dissipate and discharge electrostatic charges either as an "add on" item for existing electronic appliances or as a "built-in" protective device for electronic appliances such as microprocessors, computers and the like.

In its broadest embodiment, the apparatus according to the present invention includes a mass of conductive foam material which has several magnets embedded therein so that a closed loop magnetic field extends in the interior of the conductive foam body. The foam body is mounted in an enclosure or housing, and an electrical ground contact is embedded in the foam body in a region of relatively high magnetic flux density. This electrical ground contact is connectable by a ground lead to any convenient electrical ground. An input contact makes electrical connection to the foam body at a portion thereof spaced from the electrical ground contact, and an input probe may be connected to the input contact by means of a probe lead. A pick-up head is provided which adheres to the electrical appliance, such as the appliance case or the face of a cathode-ray display tube. The probe head is formed of a conductive foam of sufficient resistivity to transfer the electrostatic charge to the foam body through the input contact. The foam body is of sufficient internal and surface resistivity to dissipate the electrostatic charge, under the influence of the magnetic field, so that it may be conducted to ground potential by means of the ground lead.

The preferred method according to the present invention thus broadly includes the steps of making an electrical contact with an electrical appliance by means of a conductive lead in order to receive the electrostatic charge; dissipating electrostatic charge under the influence of a magnetic shield maintained in a conductive foam body that is electrically connected to the conductive lead; and discharging to ground potential the electrical charge dissipated through said foam body by means of a ground lead electrically interconnecting the conductive foam body and a grounding structure.

In the preferred embodiment of the present invention, the housing is in the form of a hollow enclosure constructed of an insulating material, such as plastic. An inner surface of the hollow enclosure is provided with a conductive film, such as a metal layer, and the conductive foam body is mounted in this hollow enclosure, in spaced relation from the metallized layer. Preferably, the foam body is defined by at least two foam pads that are matched in size and configuration. Each foam pad has a pair of elongated magnets mounted at one end portion with one magnet being secured to the mounting surface and the second magnet being partially embedded in the foam pad through the mounting surface. The mounting surfaces of both foam pads are then placed in abutment so that a first pair of magnets is at one end of the foam body and the second pair of magnets is at the other end of the foam body. The magnets on one foam pad compress the other foam pad, and all of the magnets are oriented so that the north pole of each magnet faces a south pole of an adjacent magnet around a generally closed loop path of concentrated magnetic flux. The ground lead is embedded in the foam body between two magnets at one end thereof within the region of high magnetic flux density.

These and other objects of the present invention will become more readily appreciated and understood from a consideration of the following detailed description of the preferred embodiment when taken together with the accompanying drawings, in which:

DETAILED DESCRIPTION OF THE PREFERRED EMBODIMENT

The present invention is directed to an apparatus and a method for dissipating and discharging electrostatic charges which may accumulate on the surface of an electrical appliance, cathode-ray tube and the like. As such, the apparatus is designed as an "add on" protective device that may electrically interconnect the surface that is to be discharged and the electrical grounding structure so that the electrostatic charge on the appliance may be received by the apparatus and then dissipated and discharged through a ground lead electrically connected to the grounding structure.

Figure 1:
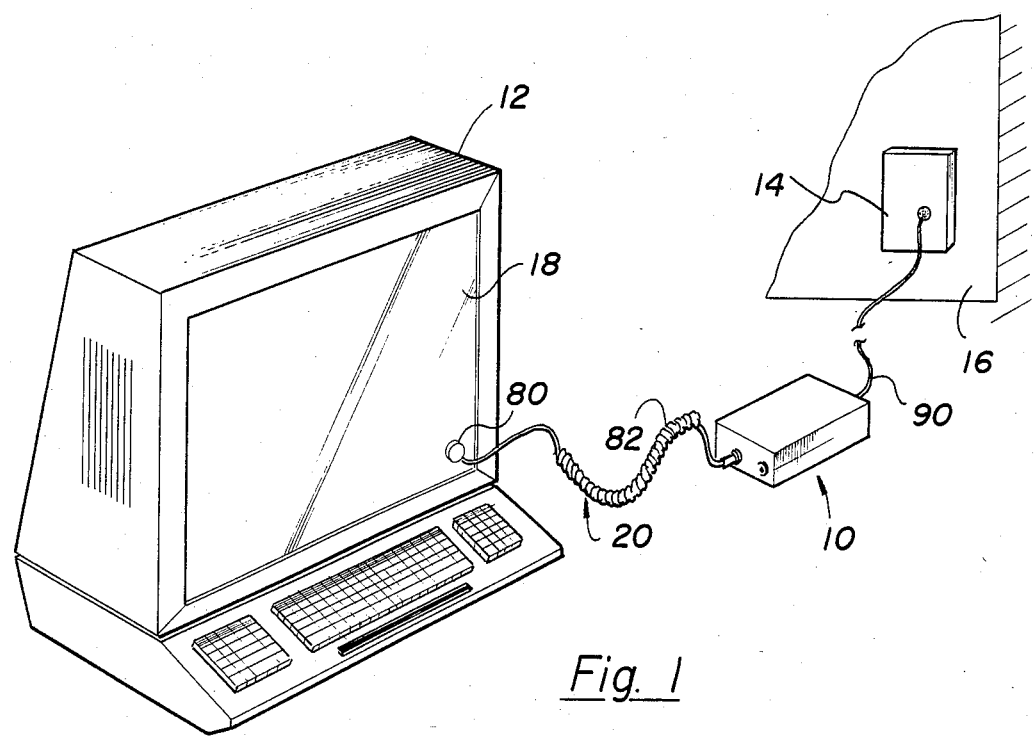
FIG. 1 is a perspective view of the preferred embodiment of the present invention shown attached between an electrical appliance and an electrical ground structure so that the electrostatic charge accumulated on the appliance may be discharged to ground according to the apparatus and method of the preferred embodiment of the present invention.
Figure 2:
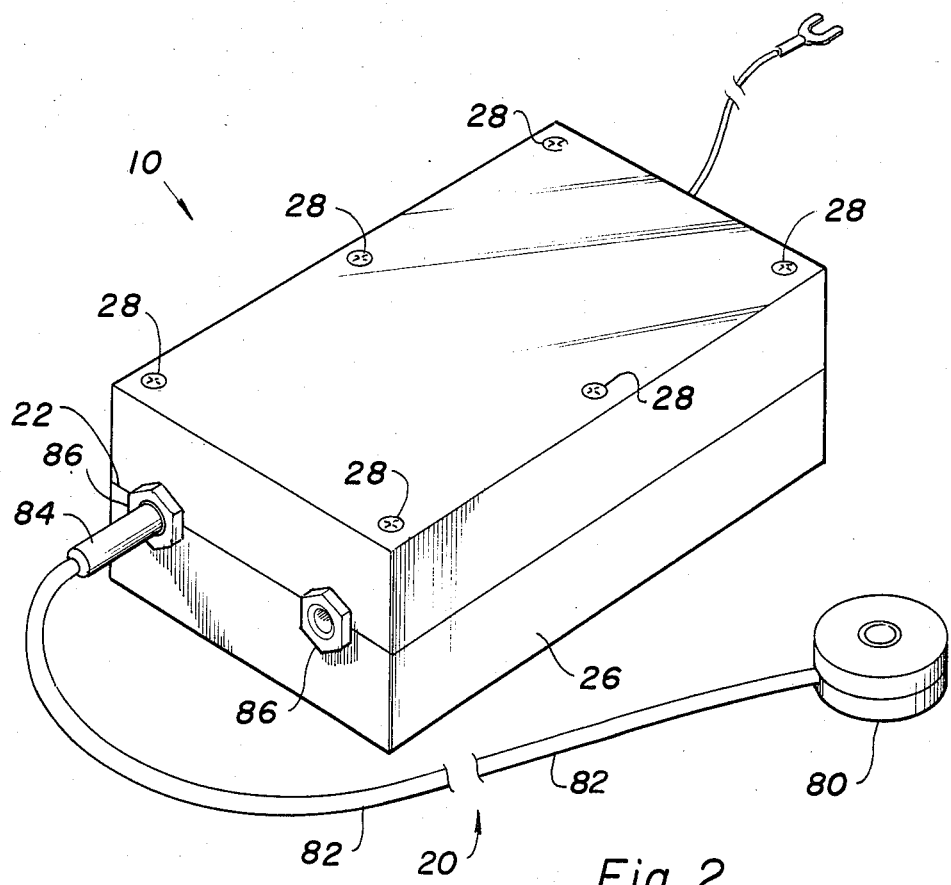
FIG. 2 is a perspective view of the apparatus for dissipating and discharging electrostatic charges according to the preferred embodiment of the present invention.
Figure 3:
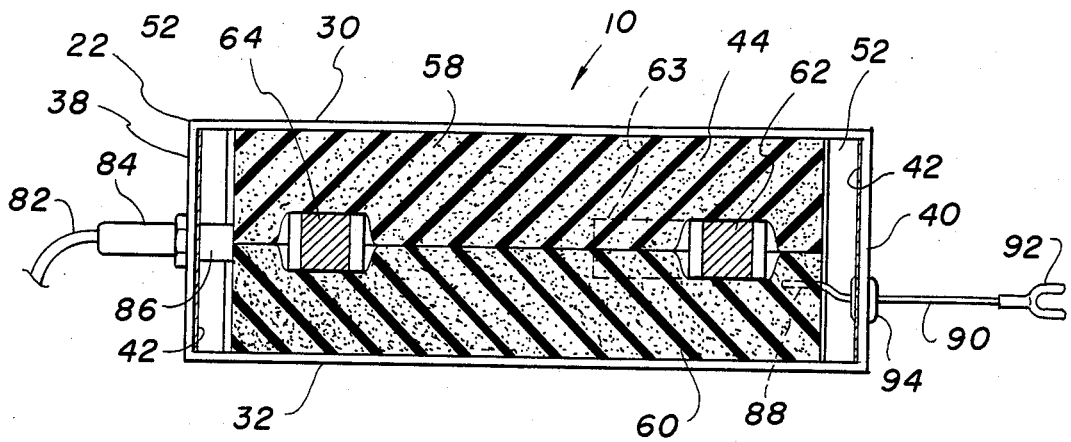
FIG. 3 is a cross-sectional view of the apparatus shown in FIG. 2.

Accordingly, as is shown in FIG. 1, the protective apparatus or device 10 according to the preferred embodiment of the present invention is shown interconnecting an electrical appliance 12 and a grounding structure 14 such as a grounding box attached to a wall 16 or the like. While appliance 12 is shown as a display having a cathode-ray tube 18 to which probe 20 of apparatus 10 is secured, it should be appreciated that apparatus 10 is useful to dissipate and discharge electrostatic charges which may accumulate on a wide range of electrical appliances. Further, it should be understood that the apparatus and method according to the preferred embodiment of the present invention may be manufactured integrally with appliance 12 in addition to being an "add on" or retrofit protective device.

As is best shown in FIGS. 2, 3, 5 and 6, protective device 10 includes a generally rectangular housing 22 formed of a top section 24 and a bottom section 26 which are secured to one another by means of screws 28. Housing 22 includes a top wall 30 and a bottom wall 32 formed in sections 24 and 26, respectively. Side walls 34 and 36 and end walls 38 and 40 are also formed by sections 24 and 26. Side walls 34, 36 and end walls 38, 40 include a metal film defining a conductive layer 42 on the inner surface of housing 22.

A rectangular mass of open celled conductive foam defines a foam body 44 that is positioned in housing 22 by means of a plurality of webs 46 projecting laterally of side walls 34 and 36. Thus, open regions 48 and 50 are formed between foam body 44 and side walls 36 and 38, respectively. Similarly, webs 52 position foam body 44 in spaced relation to end walls 38 and 40 so that open regions 54 and 56 are defined between end walls 38 and 40, respectively. Foam body 44 is preferably formed of a pair of plate-like foam pads, with a pad 58 being positioned in top section 24 and a pad 60 being positioned in bottom section 26.

Figure 4:
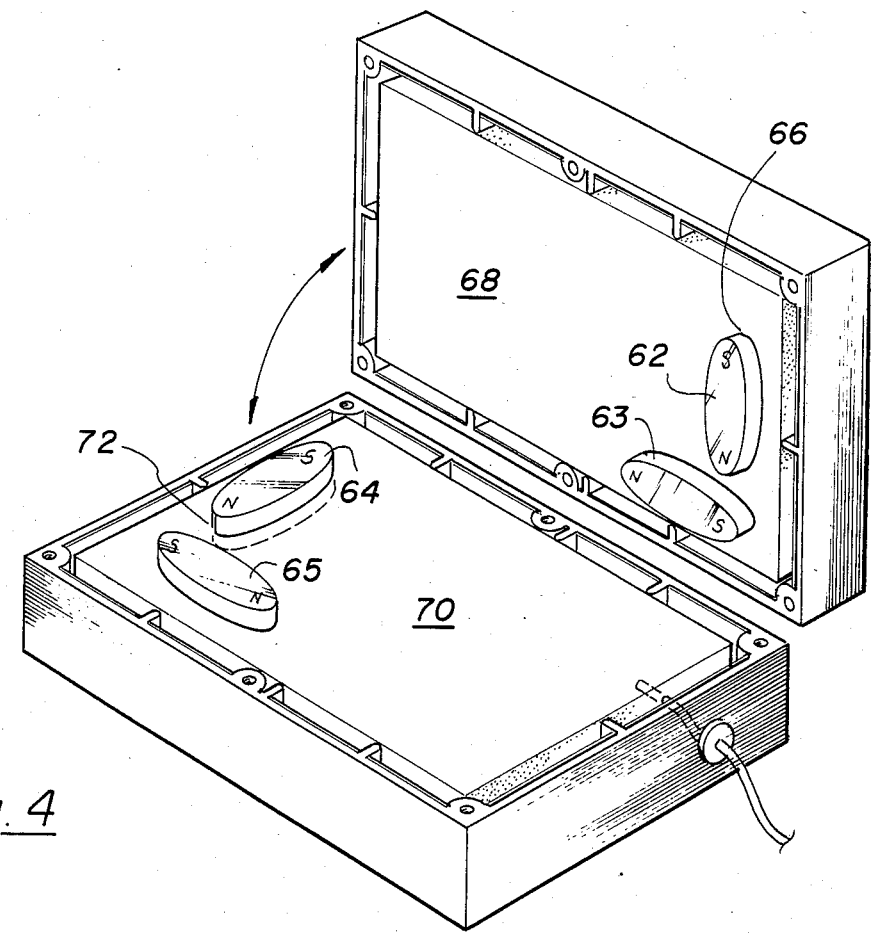
FIG. 4 is a perspective view of the foam pads that define the foam body and showing the first and second magnet pairs according to the preferred embodiment of the present invention.
Figure 5:
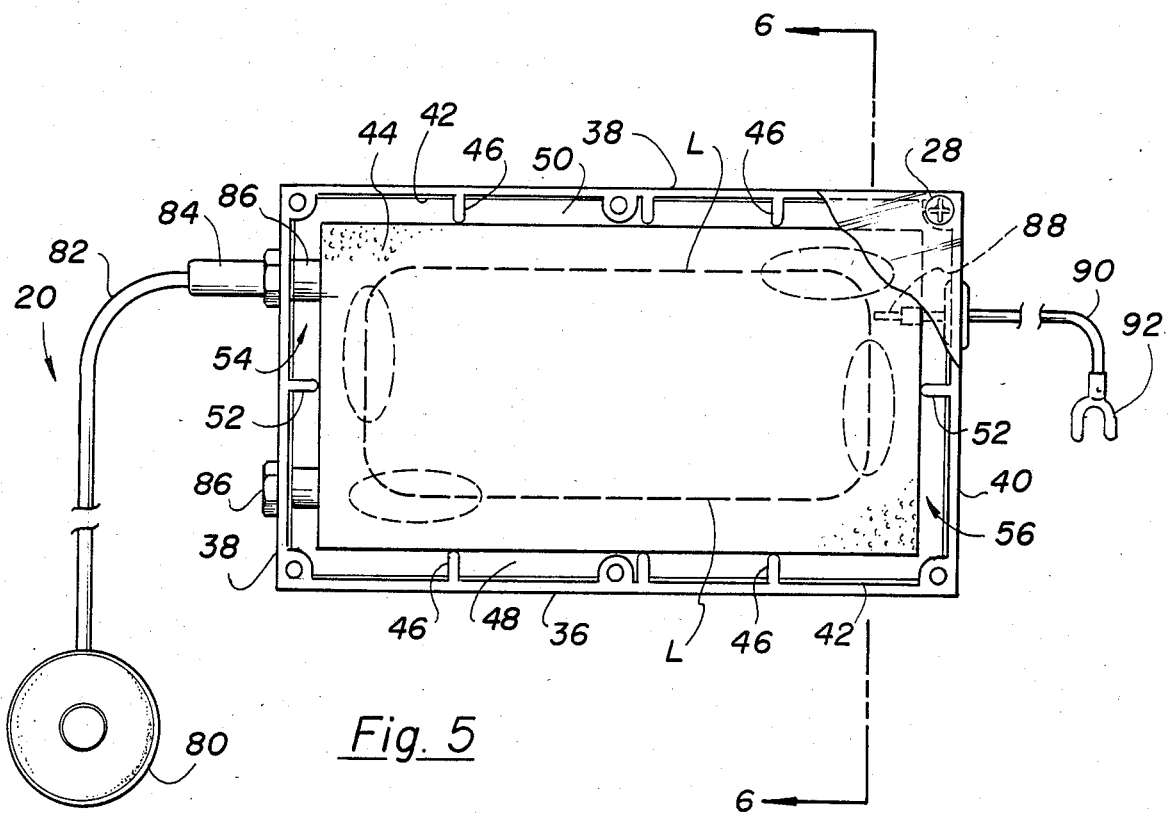
FIG. 5 is a partially broken away top view of the apparatus shown in FIGS. 2 and 3.
Figure 6:
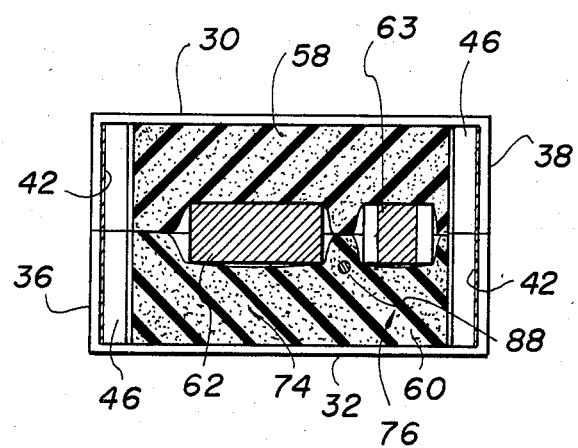
FIG. 6 is a cross-sectional view taken about line 6—6 of FIG. 5.

Magnetic means is embedded in foam body 44 in order to direct charge flow therethrough. Specifically, as is best shown in FIGS. 4, 5 and 6, a plurality of magnets are mounted to foam pads 58 and 60 along the perimeter of a closed, generally rectangular reference loop L shown in FIG. 5, with loop L having a smaller dimension than foam body 44. As is shown in FIG. 4, four elongated, generally ellipsoid magnets 62, 63, 64 and 65 define magnet pairs which are respectively attached to foam pads 58 and 60. Specifically, a first magnet pair is formed by magnets 62 and 63 and are oriented on one end portion of foam pad 58. A magnet 62 is partially embedded in cavity 66 which is configured to be the same size as magnet 62 and which is formed in mounting face 68 of foam pad 58. Magnet 63 is directly adhered to mounting face 68 and is oriented generally perpendicularly to magnet 62 with its south magnetic pole facing the north magnetic pole of magnet 62. The second magnet pair is formed by magnets 64 and 65 which are positioned on mounting face 70 of foam pad 60, and are oriented along one end portion of foam pad 60 that is opposite magnet pair 62, 63 when pads 58 and 60 are positioned together to define foam body 44. Magnet 64 is partially embedded in a cavity 72 formed in mounting face 70 while magnet 65 is directed adhered onto face 70. Further, the north magnetic pole of magnet 62 faces the south pole of adjacent magnet 65 with magnet 64 and 65 generally being perpendicular to one another.

Based on the foregoing description of magnets 62–65, it should be appreciated that when foam pads 58 and 60 are placed together, mounting faces 68 and 70 are in abutting relationship. Further, when pads 58 and 60 are positioned together to form foam body 44 and body 44 is mounted in housing 22, magnets 62–65 are oriented along loop L such that each magnet's north pole is facing an adjacent magnet's south pole so that loop L describes a region of relatively concentrated magnetic field. Further, each pair of magnets operates to mechanically compress the foam pad other than that to which it is attached. For example, as is shown in FIG. 6, magnets 62 and 63, which are mounted to foam pad 58 and form one magnet pair, mechanically compress foam pad 60 at regions 74 and 76, respectively. As discussed below, foam body 44, along with magnets 62–65 and conductive layer 42 dissipate static charge from appliance 12.

Foam body 44 receives electrostatic charge from appliance 12 by means of probe 20 which includes pick-up head 80 connected to electrical lead 82 that terminates in banana plug 84 opposite pick-up head 80. A pair of input contacts 86 in the form of female banana connectors, extend through end wall 38 so that, when banana plug 84 is mateably received by input contact 86, electrical connection is made to foam body 44.

In order to discharge foam body 44, a ground contact 88 is embedded in foam pad 60 generally between magnets 62 and 63 in a region of maximum magnetic flux density, as is shown in FIG. 6. Contact 88 receives ground lead 90 which terminates in a mounting clip 92 that is electrically connectable to grounding structure 14 with lead 90 extending through a locking grommet 94 mounted in end wall 40. Thus, it should be appreciated that ground contact 88 is oriented at an opposite end portion of foam body 44 than are input contacts 86, with ground contact 88 being located at a region of relatively high magnetic field flux.

Figure 8:
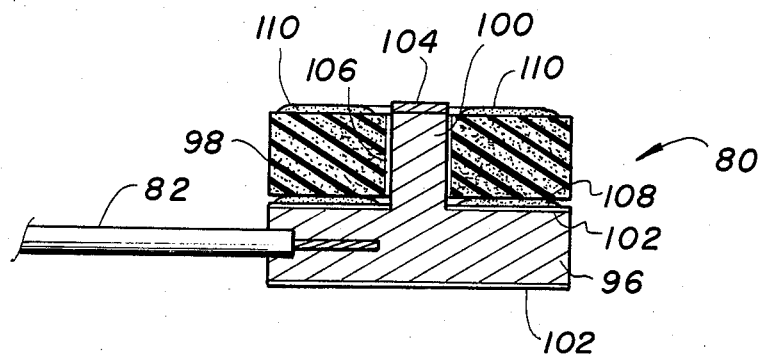
FIG. 8 is a cross-sectional view of the probe head according to the preferred embodiment of the present invention.
Figure 7:
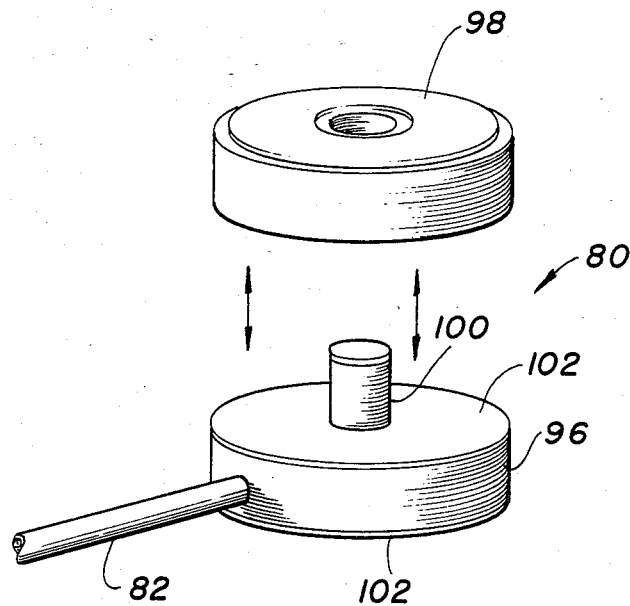
FIG. 7 is an exploded view of the probe head according to the preferred embodiment of the present invention.

As is shown in FIGS. 7 and 8, pick-up head 80 is constructed in two pieces, comprising conductive disk 96 and insulating annulus 98. Specifically, disk 96 is constructed of a cross-linked conductive foam and includes a centrally located, upstanding nub 100. Conductive disk 96 includes a carbon laminate layer 102 formed of heat treated carbon, and nub 100 has an upper contact surface, also provided with a carbon laminate layer 104. Pick-up lead 82 is embedded in the conductive foam forming disk 96 so that an electrical path is formed between laminate layer 104 and lead 82. Annulus 98 is constructed of an insulating foam material in a disk-shaped configuration having an axial bore 106 formed therethrough. As is shown in FIG. 8, nub 100 extends through bore 106 so that laminate layer 104 protrudes above annulus 98 so that it may make electrical contact with the surface of which an electrostatic charge tends to accumulate. Disk 96 and annulus 98 are adhered to one another by adhesive layer 108, and pick-up head 80 may be releaseably secured to appliance 12 by means of an adhesive layer 110 formed on an outer flat surface of annulus 98.

In order to obtain the best results with protective device 10, it has been found that conductive foam forming foam body 44 be formed of a conductive foam having a volume resistivity of $10^4$ to $10^7$ ohms per square. Preferably, conductive foam is formed of any open celled plastic material, such as polyurethane, that is impregnated with carbon to the desired volume resistivity. Preferably the foam body 44 has a surface resistivity on the order of $10^3$ to $10^5$ ohms per square. Magnetics 62–63 may be any magnetic means, but preferably permanent magnets in the form of ellipsoidal electrified plastic magnets, as is known in the art. Preferably, magnets 62–64 have a magnetic strength within a range of approximately 100 to 250 gauss.

Pick-up head 80 is preferably formed of a conductive foam having a surface resistivity of $10^5$ to $10^7$ ohms per square and a volume resistivity generally within the same range. Preferably, the annulus 98 is an insulating foam having a volume resistivity of $10^{10}$ to $10^{12}$ ohms per square.

Since electrostatic discharges on the order of 20,000 volts would typically be encountered by electrical appliances, such as cathode-ray tubes, microprocessors and the like, it is important that the pick-up lead 82 and the ground lead 90 be of sufficient guage that can transfer 20,000 volts of electricity at low amperage in less than two seconds. To this end, also, it is important that the conductive foam material of foam body 44, described above, be sufficient to dissipate this amouont of electricity. To this end, compression regions of pads 58 and 60, such as regions 74 and 76, are provided since the compressed regions effectively change the resistivity of the foam body to allow charges to collect with the static decay rate of 20,000 volts in a time interval of less than two seconds.

Based on the foregoing, it should be appreciated that the method of dissipating and discharging electrostatic charge accumulated on appliances comprises the broad steps of making an electrical contact with the appliance by means of a conductive lead to receive the electrostatic charge; dissipating the electrostatic charge under the influence of a magnetic field maintained in a conductive foam body that is electrically connected to the conductive lead; and discharging to ground potential the electrostatic charge dissipated by the foam body by means of a ground lead electrically connected to the foam body and to the ground potential.

With greater specificity, the perffered method includes the steps of dissipating the electrostatic charge through a closed loop magnetic field of relatively high field density on the order of approximately 75 to 180 gauss, and under the influence of a metallic shell surrounding the foam body, in spaced relation thereto. The step of discharging the electrostatic charge dissipated by the foam body is accomplished by the ground lead that is embedded in the foam body in a region of relatively high magnetic flux density so that a charge of approximately 20,000 volts, at low amperage, may be dissipated and discharged over a static decay interval of less than two seconds.

Accordingly, the present invention has been described with some degree of particularity directed to the preferred embodiment of the present invention. It should be appreciated, though, that the present invention is defined by the following claims construed in light of the prior art so that modifications or changes may be made to the preferred embodiment of the present invention without departing from the inventive concepts contained herein.

I claim:

1. Apparatus adapted for dissipating and discharging electrostatic charge accumulated on an appliance, comprising:
    an enclosure having an inner surface and an outer surface and formed of an insulating material;
    a conductive foam body positioned in said enclosure;
    magnet means in said enclosure and in contact with said foam mass for producing a loop-shaped magnetic field throughout the foam body;
    a contact structure electrically connected to said foam body;
    a ground wire electrically connected to said foam body at a point spaced from said contact structure and adapted to electrically connect said foam body to an electrical ground; and
    a contact probe electrically connected to said contact structure and adapted to be electrically connected to said appliance whereby accumulated electrostatic charge on the appliance may be passed through the foam body to the ground potential.

2. Apparatus according to claim 1 wherein said foam body has a volume resistivity of approximately $10^4$ to $10^7$ ohms per square and a surface resistivity of approximately $10^3$ to $10^5$ ohms per square.

3. Apparatus according to claim 1 wherein said magnet means includes a plurality of permanent magnets embedded in said foam body.

4. Apparatus according to claim 3 wherein said magnets are oriented along the perimeter of a reference loop generally in the shape of a rectangle having dimensions smaller than said foam body.

5. Apparatus according to claim 4 wherein said foam body is generally in the shape of a rectangular prism, said enclosure being in the general shape of a rectangular housing having a top wall, a bottom wall, a pair of elongated side walls and a pair of end walls, said foam body being spaced from each of said side walls.

6. Apparatus according to claim 4 wherein said magnets are ellipsoid in shape and arranged with respect to one another whereby each magnet's north pole is facing an adjacent magnet's south pole.

7. Apparatus according to claim 6 wherein there are four magnets, each of said magnets being aligned along a respective side of said reference loop.

8. Apparatus according to claim 6 wherein said ground wire includes a ground contact embedded in said foam body at a location between the respective north and south poles of an adjacent pair of magnets.

9. Apparatus according to claim 8 wherein said ground contact is located in a region of maximum magnetic flux density between said adjacent pair of magnets.

10. Apparatus according to claim 9 wherein said contact structure and said ground contact are positioned at opposite end portions of said foam body.

11. Apparatus according to claim 1 wherein a portion of the inner surface of said enclosure is coated with a conductive layer to define a conductive shell around the perimeter of said foam body.

12. Apparatus according to claim 11 wherein said shell is a metal layer formed on the inner side wall of said enclosure.

13. Apparatus according to claim 1 wherein said probe includes a pick-up head electrically connected to a lead wire electrically connected to said contact structure, said pick-up head including a pad of conductive foam having a raised nub and a layer of non-conductive foam secured to said pad and surrounding said nub, said layer having an exposed face provided with an adhesive material whereby said probe may be adhered to said appliance with said nub in electrical communication therewith.

14. Apparatus according to claim 13 wherein said lead wire is releaseably secureable to said contact structure.

15. Apparatus according to claim 13 wherein said pad is constructed of cross-linked conductive foam, said nub having a contact surface laminated with a carbon that is heat treated to form a stable carbon layer.

16. Apparatus according to claim 15, wherein said pad has a volume resistivity and a surface resistivity both with a range of $10^5$ to $10^7$ ohms per square.

17. Apparatus adapted for dissipating and discharging electrostatic charge accumulated on an appliance, comprising:
 a hollow enclosure having an inner surface and an outer surface and formed of an insulating material;
 a first foam pad defined by a first plate-like mass of open celled conductive foam having a first mounting face, and a second foam pad defined by a second plate-like mass of open celled conductive foam having a second mounting face, said first and second foam pads positionable together with said first and second mounting faces abutting one another to define a foam body mounted in said enclosure;
 a first pair of elongated first magnets secured to said first foam pad on an end portion thereof in generally perpendicular relation to one another with one of said first magnets mounted on said first mounting face and the other of said first magnets embedded in said first foam pad with a portion protruding out of said first mounting face;
 a second pair of elongated second magnets secured to said second foam pad on an end portion thereof in generally perpendicular relation to one another with one of said second magnets mounted on said second mounting face and the other of said second magnets embedded in said second foam pad with a portion protruding out of said second mounting face;
 said first and second foam pads being positioned together so that said first magnet pair and said second magnet pair are at opposite end portions of said foam body when said foam body is mounted in said enclosure, said magnets being positioned along the perimeter of a generally rectangular loop and oriented in said foam body such that each magnet's north pole is facing an adjacent magnet's south pole, said first magnet pair operative to mechanically depress the second foam pad and said second magnet pair operative to depress the first foam pad;
 an input contact structure at one end portion of said foam body adjacent one of said first and second magnet pairs and a ground contact structure at the other end portion of said foam body adjacent the other of said first and second magnet pairs;
 a ground lead connectable to said ground contact and operative to allow electrical grounding of said foam body; and
 a contact probe having a contact lead electrically connectable to said input contact structure and a pick-up head adapted to be secured to said appliance in electrical communication therewith whereby electrostatic charge may be passed from said appliance to said foam body, dissipated through said foam body and discharged to ground potential.

18. Apparatus according to claim 17 wherein said foam body has a volume resistivity within a range of $10^4$ and $10^7$ ohms per square and a surface resistivity within a range of $10^3$ to $10^5$ ohms per square.

19. Apparatus according to claim 17 wherein said ground contact structure is located between one of said first and second magnet pairs.

20. Apparatus according to claim 17 wherein said magnets have a strength generally within a range of 100 to 250 gauss.

21. Apparatus according to claim 17 including an annular conductive shell around the perimeter of said foam body.

22. Apparatus according to claim 21 wherein said shell is defined by a metallic layer formed on the inner surface of the enclosure.

23. Apparatus according to claim 17 wherein said probe includes a pick-up head formed as a disk of a conductive foam having a volume resistivity and a surface resistivity within a range of $10^5$ to $10^7$ ohms per square, said disk including an upstanding nub and said pick-up head having an insulating annulus surrounding said nub.

24. The method of dissipating and discharging electrostatic charge accumulated on an appliance, comprising the steps of:

making an electrical contact with said appliance by means of a conductive lead to receive said electrostatic charge;

dissipating said electrostatic charge under the influence of a magnetic field maintained in a conductive foam body electrically connected to said conductive lead; and discharging to ground potential the electrostatic charge dissipated through said foam body by means of a ground lead elecrically connected to said foam body.

25. The method of claim 24 wherein said magnetic field has a strength of approximately 75 to 180 gauss.

26. The method of claim 24 wherein said foam body has a conductive shell around its perimeter.

27. The method of claim 24 wherein said ground lead is embedded in the foam body at a region of high magnetic flux density.

* * * * *